United States Patent
Wang et al.

(10) Patent No.: US 9,640,447 B2
(45) Date of Patent: May 2, 2017

(54) TEST CIRCUIT AND METHOD

(71) Applicant: Taiwan Semiconductor Manufacturing CO., LTD., Hsinchu (TW)

(72) Inventors: Mill-Jer Wang, Hsinchu (TW); Ching-Nen Peng, Hsinchu (TW); Hung-Chih Lin, Hsinchu (TW); Hao Chen, New Taipei (TW); Chung-Han Huang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 147 days.

(21) Appl. No.: 14/186,107

(22) Filed: Feb. 21, 2014

(65) Prior Publication Data

US 2015/0241508 A1 Aug. 27, 2015

(51) Int. Cl.
*G01R 1/04* (2006.01)
*G01R 31/26* (2014.01)
*H01L 21/66* (2006.01)
*G01R 31/28* (2006.01)

(52) U.S. Cl.
CPC .......... *H01L 22/14* (2013.01); *G01R 31/2889* (2013.01)

(58) Field of Classification Search
CPC ..... G01R 31/2607; G01R 31/00; G01R 31/02
USPC .......................................... 324/501
See application file for complete search history.

(56) References Cited

U.S. PATENT DOCUMENTS

| 5,311,116 A | * | 5/1994 | Rogers | ................. | G01R 31/002 324/627 |
| 2005/0017729 A1 | * | 1/2005 | Tsuji | .................... | G01R 31/309 324/501 |
| 2008/0099762 A1 | * | 5/2008 | Garcia | ............. | G01R 31/31704 257/48 |
| 2013/0162282 A1 | * | 6/2013 | Hatakeyama | ........... | H01L 22/30 324/762.01 |

\* cited by examiner

*Primary Examiner* — Son Le
*Assistant Examiner* — Zannatul Ferdous

(57) ABSTRACT

A circuit is disclosed that includes a signal-forcing path, a discharging path, a contact probe, a monitoring probe and a switch module. The signal-forcing path is connected to a signal source. The discharging path is connected to a discharging voltage terminal. The contact probe contacts a pad module of an under-test device. The monitoring probe generates a monitored voltage associated with the pad module. The switch module is operated in a discharging mode to connect the contact probe to the discharging path when the monitored voltage does not reach a threshold voltage such that the under-test device is discharged and is operated in an operation mode to connect the contact probe to the signal-forcing path when the monitored voltage reaches the threshold voltage such that a signal generated by the signal source is forced to the under-test device.

20 Claims, 8 Drawing Sheets

TEST CIRCUIT AND METHOD

BACKGROUND

During the manufacturing process of integrated circuits, various tests are performed at one or more stages to ensure that a finished product functions adequately. Parts of the tests are performed by connecting test probes to test pads on an under-test device. These test pads provide electrical test access points for test equipment. In operation, the under-test device is placed in a fixture that has test probes aligned with the test access points, and is tested by the test equipment through the test probes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
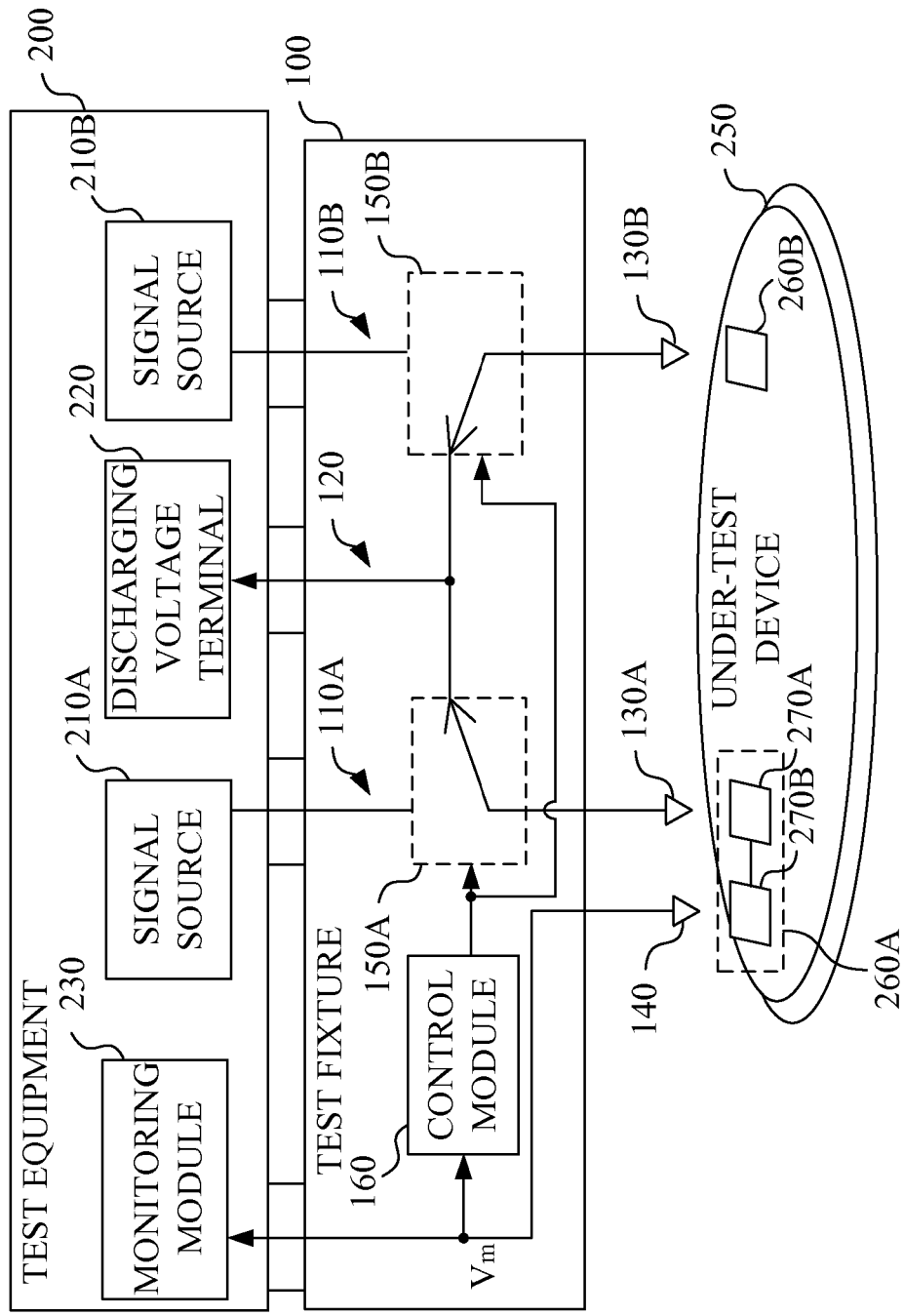
FIG. 1A is an exemplary diagram of a test fixture and a test equipment that are electrically isolated from an under-test device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
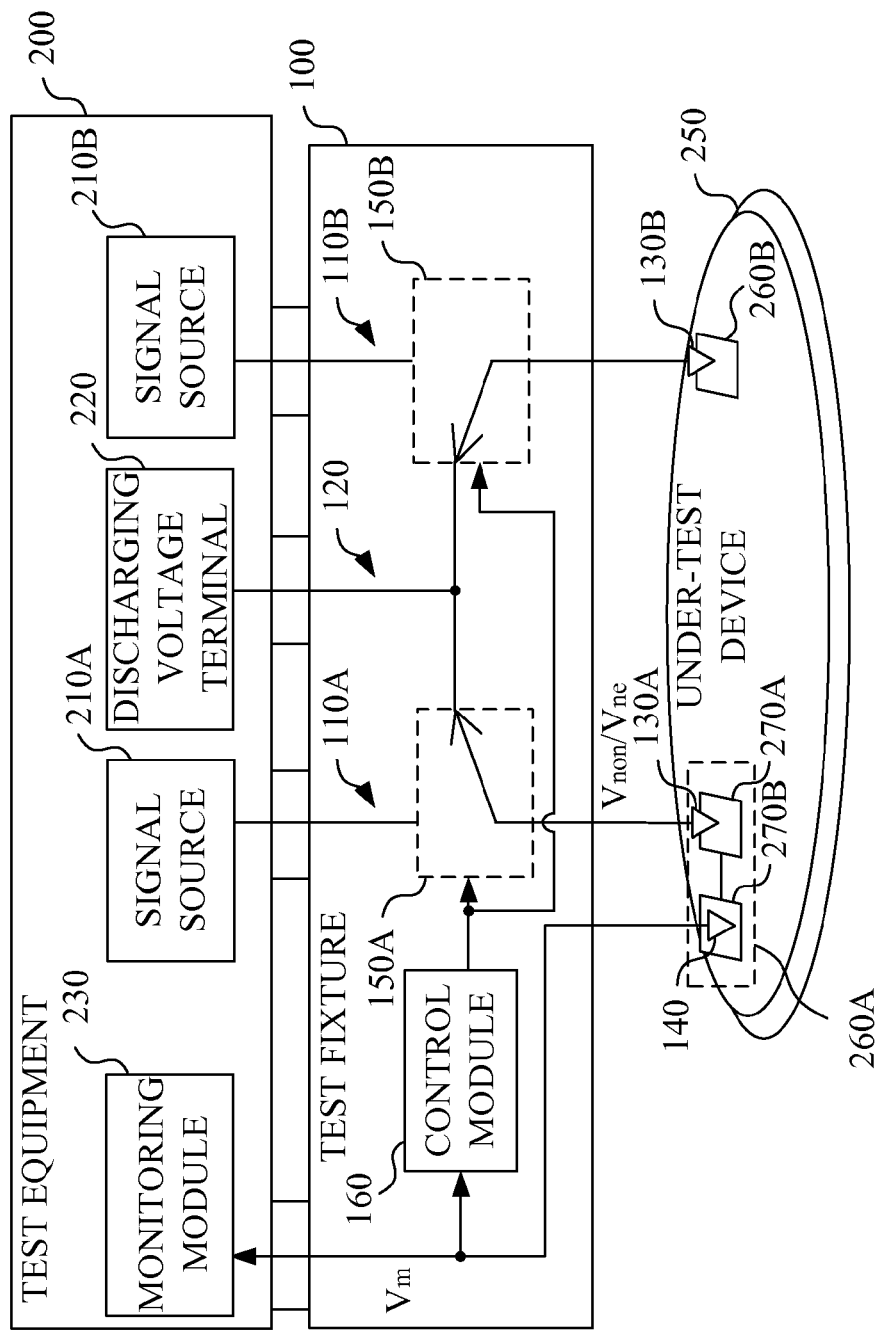
FIG. 1B is an exemplary diagram of the test fixture and the test equipment that are electrically connected to the under-test device in accordance with various embodiments of the present disclosure.

FIG. 1A is an exemplary diagram of a test fixture 100 and a test equipment 200 that are electrically isolated from an under-test device 250 in accordance with various embodiments of the present disclosure. FIG. 1B is an exemplary diagram of the test fixture 100 and the test equipment 200 that are electrically connected to the under-test device 250 in accordance with various embodiments of the present disclosure.

Figure 2:
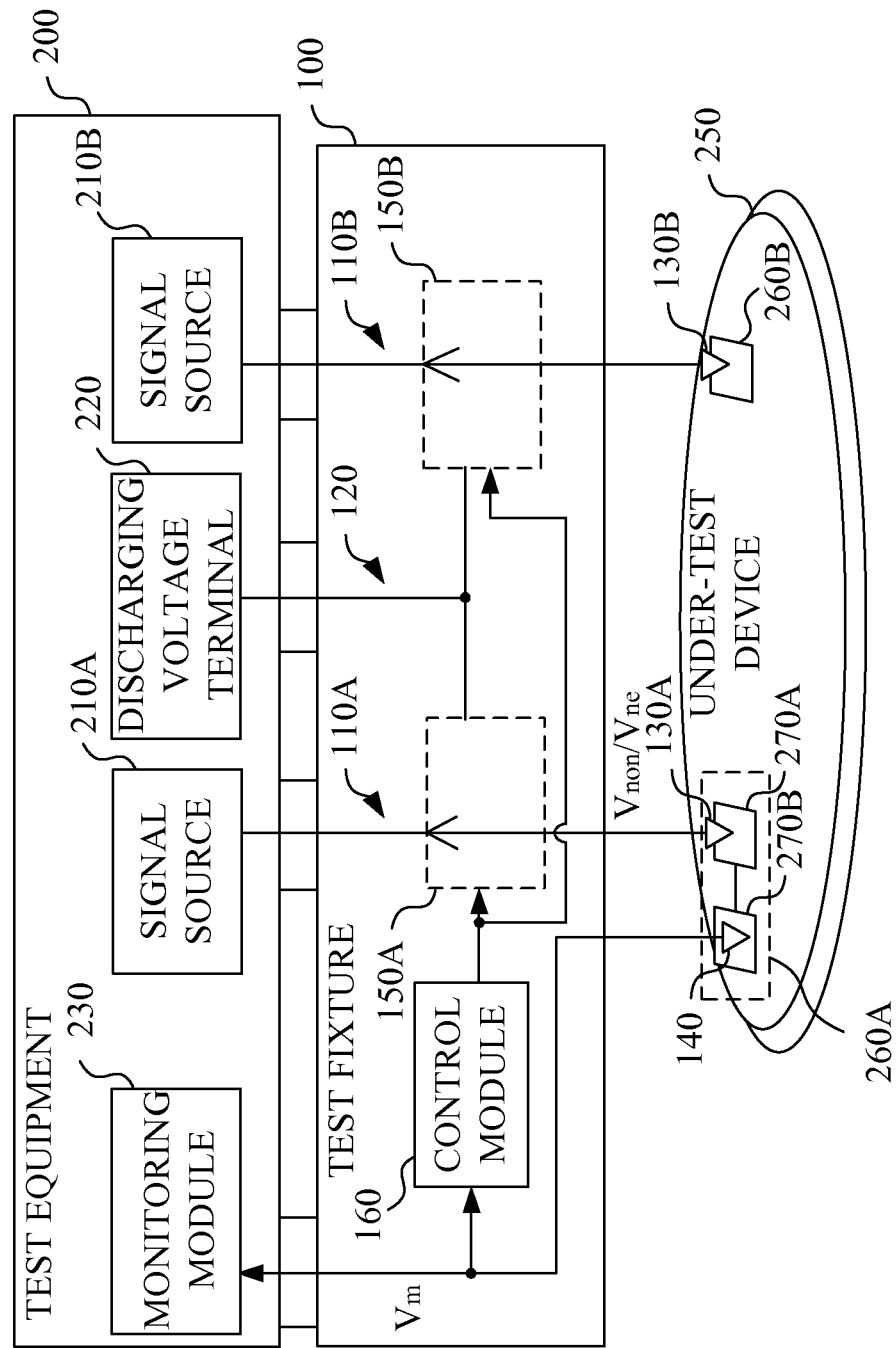
FIG. 2 is an exemplary diagram of the test fixture and the test equipment together with the under-test device in an alternative operation state in accordance with various embodiments of the present disclosure.

FIG. 2 is an exemplary diagram of the test fixture 100 and the test equipment 200 that are electrically connected to the under-test device 250 in an alternative operation state in accordance with various embodiments of the present disclosure.

For illustration, the test equipment 200 is connected to the under-test device 250 through the test fixture 100. In some embodiments, the test equipment 200 discharges the under-test device 250 through the test fixture 100 to prevent the under-test device 250 from being damaged by electrostatic charges caused by contact. Moreover, the test equipment 200 performs test on the under-test device 250 subsequently by forcing signals to the under-test device 250 through the test fixture 100. In some embodiments, the test equipment 200 is an automatic test equipment (ATE).

As illustrated in FIG. 1A, the test fixture 100 includes signal-forcing paths 110A and 110B, a discharging path 120, contact probes 130A and 130B, a monitoring probe 140 and switch modules 150A and 150B. The test equipment 200 includes signal sources 210A and 210B and a discharging voltage terminal 220.

The signal-forcing paths 110A and 110B are connected to the signal sources 210A and 210B respectively. In some embodiments, each of the signal sources 210A and 210B is either a power signal source for supplying a power signal, a data signal source for supplying a data signal, or a ground signal source for supplying a ground signal.

The discharging path 120 is connected to the discharging voltage terminal 220. In some embodiments, the discharging voltage terminal 220 is a ground voltage terminal having a ground voltage.

The contact probe 130A is configured to contact a pad module 260A of the under-test device 250. Moreover, according to different operations of the switch module 150A, the contact probe 130A is either connected to the discharging path 120 as illustrated in FIG. 1, or is connected to the signal-forcing path 110A as illustrated in FIG. 2. Similarly, the contact probe 130B is configured to contact a pad module 260B of the under-test device 250. Moreover, according to different operations of the switch module 150B, the contact probe 130B is either connected to the discharging path 120 as illustrated in FIG. 1, or is connected the signal-forcing path 110B as illustrated in FIG. 2.

In some embodiments, different operations of the switch modules 150A and 150B are performed according to a monitored voltage $V_m$ associated with the pad module 260A generated by the monitoring probe 140.

Figure 3:
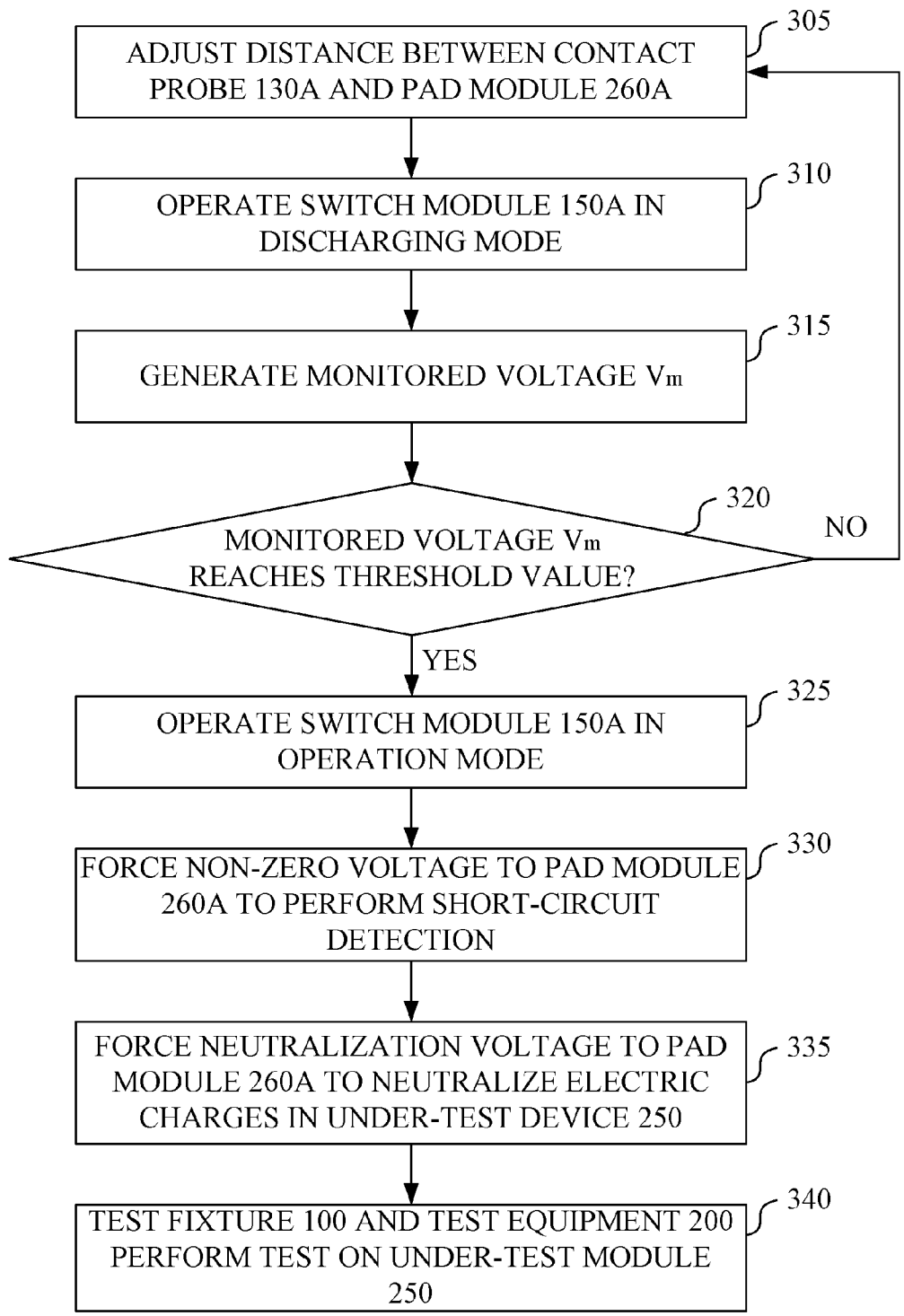
FIG. 3 is an exemplary diagram of an operation method in accordance with various embodiments of the present disclosure.

FIG. 3 is an exemplary diagram of an operation method 300 in accordance with various embodiments of the present disclosure. In some embodiments, the operation method 300 is applied to the test fixture 100 and the test equipment 200 illustrated in FIG. 1A, FIG. 1B and FIG. 2. For illustration, operations of the test fixture 100 and the test equipment 200 illustrated in FIG. 1A, FIG. 1B and FIG. 2 are described by the operation method 300.

In operation 305, a distance between the contact probe 130A and the pad module 260A is adjusted, such that the contact probe 130A approaches the pad module 260A.

In an initial state, the contact probe 130A does not contact the pad module 260A, as illustrated in FIG. 1A. In various embodiments, the distance is adjusted either manually or automatically such that the contact probe 130A becomes gradually closer to the pad module 260A.

In operation 310, the switch module 150A is operated in the discharging mode to connect the contact probe 130A to the discharging path 120, as illustrated in FIG. 1A. More specifically, the contact probe 130A is connected to the discharging path 120 and further to the discharging voltage terminal 220 when the switch module 150A is operated in the discharging mode.

In operation 315, the monitored voltage $V_m$ associated with the pad module 260A is generated by the monitoring probe 140.

In some embodiments, the operations 305, 310 and 315 are substantially performed about the same time. Explained in a different way, the switch module 150A is operated in the discharging mode during the adjustment of the distance. Moreover, the monitoring probe 140 keeps generating the monitored voltage $V_m$ during the adjustment of the distance.

In operation 320, whether the monitored voltage $V_m$ generated by the monitoring probe 140 reaches a threshold voltage is determined. In some embodiments, the threshold voltage is a ground voltage.

In some embodiments, the test fixture 100 further includes a control module 160 to receive the monitored voltage $V_m$ to perform the determination that is performed in operation 320.

For illustration in FIG. 1A, the monitoring probe 140 does not contact the pad module 260A when the contact probe 130A does not contact the pad module 260A. Under such a condition, the monitoring probe 140 is floating. The monitored voltage $V_m$ generated by the monitoring probe 140 equals to a system voltage of the test equipment 200.

When the control module 160 determines that the monitored voltage $V_m$ does not reach the threshold voltage in operation 320, the control module 160 keeps operating the switch module 150A in the discharging mode. As a result, the flow goes back to the operation 305 to continuously adjust the distance between the contact probe 130A and the pad module 260A.

When the control module 160 determines that the monitored voltage $V_m$ reaches the threshold voltage, operation 325 is performed. In operation 325, the switch module 150A is operated in the operation mode.

For illustration in FIG. 1B, when the distance is adjusted such that the contact probe 130A contacts the pad module 260A, the monitoring probe 140 contacts the pad module 260A simultaneously. Since the switch module 150A is operated in the discharging mode, the electrostatic charges in the under-test module 250 are discharged instantly. More specifically, the electrostatic charges are discharged and move toward the discharging voltage terminal 220 through the pad module 260A, the contact probe 130A and the discharging path 120.

Under such a condition, the voltage level of the pad module 260A equals to the voltage level of the discharging voltage terminal 220, e.g., the ground voltage. Moreover, the monitored voltage $V_m$ generated by the monitoring probe 140 reaches the voltage level of the discharging voltage terminal 220 at the same time.

As a result, when the control module 160 determines that the monitored voltage $V_m$ reaches the threshold voltage, e.g. the ground voltage, the contact probe 130A is determined to contact the pad module 260A, and the under-test device 250 is determined to be discharged.

Subsequently, the control module 160 controls the switch module 150A to be operated in the operation mode. As a result, the switch module 150A connects the contact probe 130A to the signal-forcing path 110A, as illustrated in FIG. 2. More specifically, the contact probe 130A is connected to the signal-forcing path 110A and further to the signal source 210A when the switch module 150A is operated in the operation mode.

In operation 330, the signal source 210A forces a non-zero voltage $V_{non}$ to the pad module 260A through the signal-forcing path 110A to perform a short-circuited detection. In some embodiments, the non-zero voltage $V_{non}$ is substantially 0.3 volts to avoid causing damage to the pad module 260A or the circuits inside the under-test device 250.

In some embodiments, the test equipment 200 further includes a monitoring module 230 in which the monitoring probe 140 is connected thereto. In some embodiments, the monitoring module 230 receives the monitored voltage $V_m$ and displays the value thereof for users to observe the detection result. When the pad module 260A is short-circuited to the ground voltage, the monitored voltage $V_m$ becomes the ground voltage.

In operation 335, the signal source 210A forces a neutralization voltage $V_{ne}$ to the pad module 260A through the signal-forcing path 110A to neutralize electric charges in the under-test device 250.

In some embodiments, a positive neutralization voltage $V_{ne}$ is forced for a duration of time to neutralize negative electric charges in the under-test device 250. For example, a voltage of substantially 1 volt is forced for substantially 100 microseconds (ms) to perform neutralization. In various embodiments, a negative neutralization voltage $V_{ne}$ is forced for a duration of time to neutralize negative electric charges in the under-test device 250.

In operation 340, the test fixture 100 and the test equipment 200 performs test on the under-test device 250. More specifically, the signal source 210A forces a signal to the under-test module 250 through the signal-forcing path 110A, the contact probe 130A and the pad module 260A, to perform test on the under-test device 250.

Similar to the switch module 150A, the switch module 150B associated with the contact probe 130B is operated under the control of the control module 160 by using the operations described above. More specifically, the switch module 150B is operated in the discharging mode to connect the contact probe 130B to the discharging path 120, as illustrated in FIG. 1A and FIG. 1B. Further, when the monitored voltage $V_m$ reaches the threshold value, the switch module 150B is operated in the operation mode to connect the contact probe 130B to the signal-forcing path 110B, as illustrated in FIG. 2.

In some embodiments, the types of the signals forced by the signal sources 210A and 210B are different when the test is performed on the under-test device 250. For illustration, the signal source 210A forces a data signal to the pad module 260A, and the signal source 210B forces a ground signal to the pad module 260B.

Based on the operations of the test fixture 100 and the test equipment 200, the switch module 150 is operated in the discharging mode before the contact probes 130A and 130B contact the pad modules 260A and 260B, respectively. When the contact probes 130A and 130B contact the pad modules 260A and 260B, respectively, the under-test device 250 is quickly discharged. The switch module 150 is then operated in the operation mode when the monitored voltage $V_m$ is determined to reach the threshold value. As a result, the damage of the under-test device 250 due to the electrostatic charges therein caused by contact is avoided.

In some embodiments, the pad module 260A includes two electrically connected pads 270A and 270B for the contact probe 130A and the monitoring probe 140 to contact thereon, respectively, as illustrated in FIG. 2. In various embodiments, the pad module 260A includes only one pad for both of the contact probe 130A and the monitoring probe 140 to contact thereon.

In some embodiments, before the test fixture 100 operates, the test equipment 200 is configured to discharge the test fixture 100. Moreover, during the initialization stage of the test equipment 200, the test equipment 200 performs a discharging operation to discharge the electrostatic charges therein. Therefore, the damage of the under-test device 250, the test fixture 100 and the test equipment 200 due to the electrostatic charges therein caused by contact is able to be avoided.

In some embodiments, the control module 160 is disposed in the test equipment 200, instead of the test fixture 100, to control the operation of the switch module 150A. In some embodiments, the switch module 150A receives the monitored voltage $V_m$ and is operated accordingly without the control of the control module 160.

Figure 4:
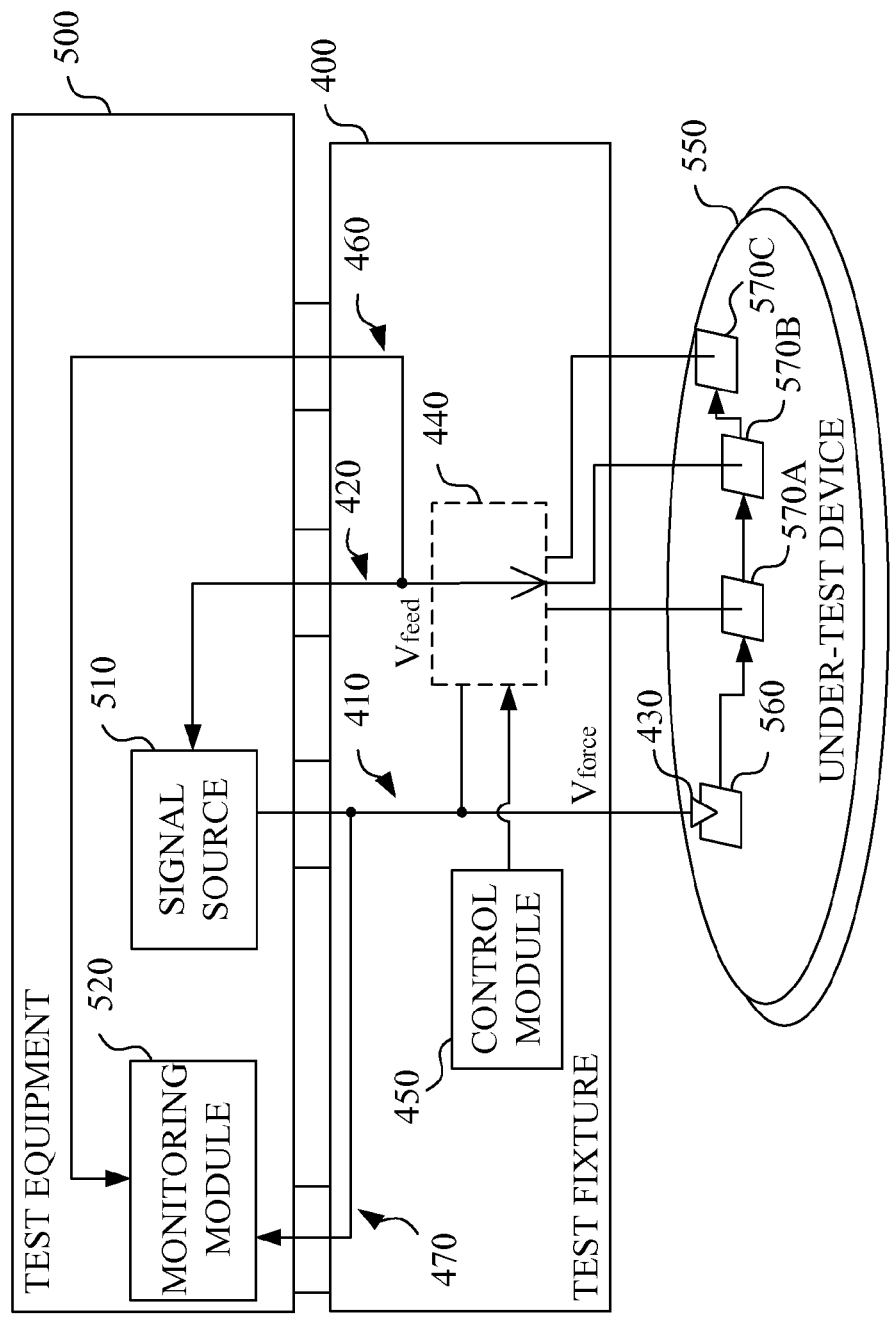
FIG. 4 is an exemplary diagram of a test fixture and a test equipment together with an under-test device in accordance with various embodiments of the present disclosure.
Figure 5:
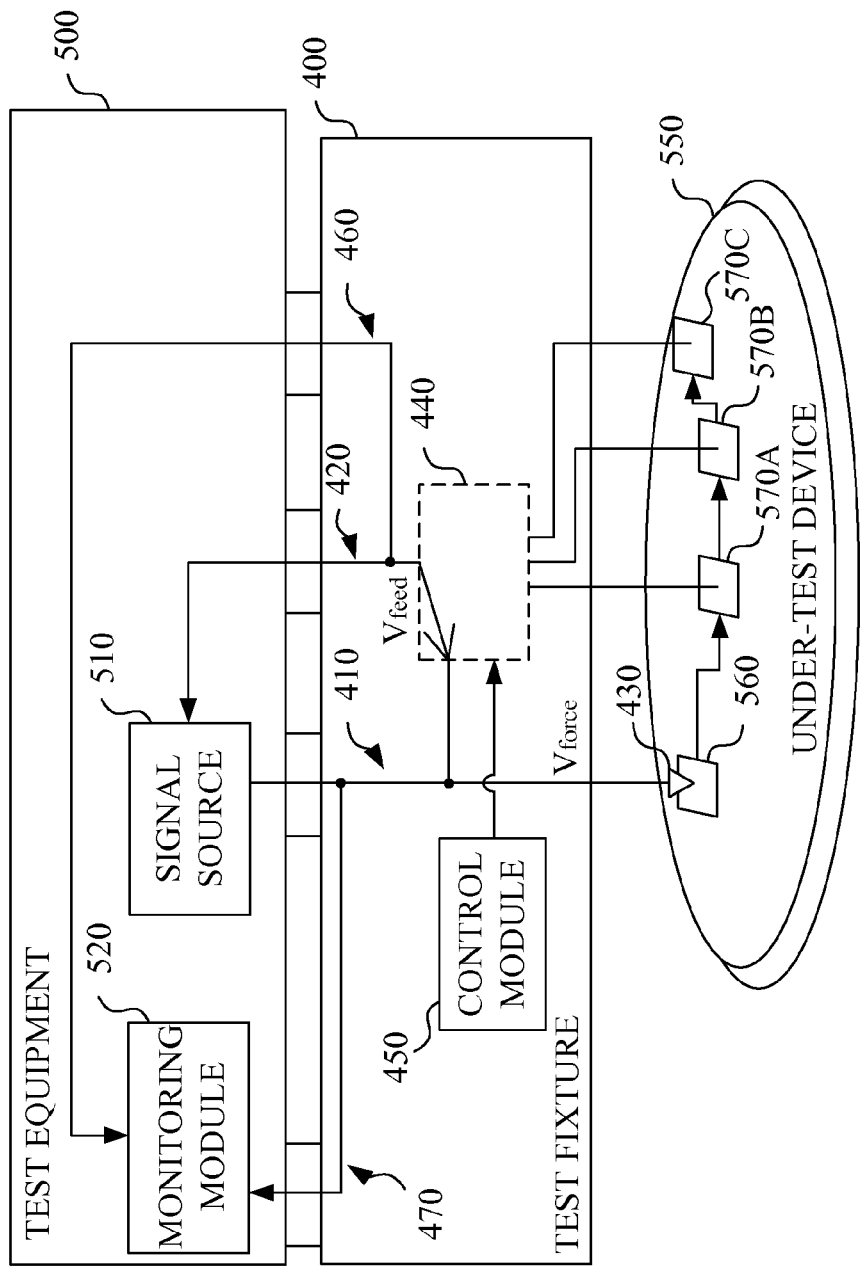
FIG. 5 is an exemplary diagram of a test fixture and a test equipment together with the under-test device in an alternative operation in state accordance with various embodiments of the present disclosure.

FIG. 4 is an exemplary diagram of a test fixture 400 and a test equipment 500 together with an under-test device 550 in accordance with various embodiments of the present disclosure. FIG. 5 is an exemplary diagram of the test fixture 400 and the test equipment 500 together with the under-test device 550 in an alternative operation state in accordance with various embodiments of the present disclosure.

In some embodiments, the test equipment 500 is connected to the under-test device 550 through the test fixture 400. Further, the test equipment 500 performs test on the under-test device 550 by forcing a signal $V_{force}$ thereon through the test fixture 400.

The test fixture 400 includes a signal-forcing path 410, a signal-sensing path 420, a signal-forcing probe 430 and a switch module 440. The test equipment 500 includes a signal source 510.

For illustration, the signal-forcing path 410 is connected to the signal source 510. The signal-forcing probe 430 is configured to connect the signal-forcing path 410 to a signal-receiving pad 560 of the under-test device 550. The signal-sensing path 420 is connected to the signal source 510.

The test equipment 500 further monitors a feedback signal $V_{feed}$ to compensate the forced signal $V_{force}$. The feedback signal $V_{feed}$ is generated from one of a plurality of feedback sources associated with the forced signal $V_{force}$. In some embodiments, the feedback sources include under-test pads 570A, 570B and 570C.

In some embodiments, the forced signal $V_{force}$ is transmitted to various locations of the under-test device 550 through the signal-receiving pad 560. Further, these locations are connected to different under-test pads, respectively, e.g., the under-test pads 570A, 570B and 570C illustrated in FIG. 4. Therefore, the under-test pads 570A, 570B and 570C receive the forced signal $V_{force}$ through the signal-receiving pad 560.

For illustration, the switch module 440 is configured to form a feedback path according to the under-test pads 570A, 570B and 570C associated with the forced signal $V_{force}$. Under such a condition, the feedback path is formed to electrically connect one of the under-test pads 570A, 570B and 570C to the signal-sensing path 420. For illustration, the under-test pad 570B is electrically connected to the signal-sensing path 420, as illustrated in FIG. 4.

In some embodiments, the feedback sources further include the signal-forcing path 410 that transmits the forced signal $V_{force}$. Under such a condition, the feedback path is formed to electrically connect the signal-forcing path 410 to the signal-sensing path 420, as illustrated in FIG. 5.

Figure 6:
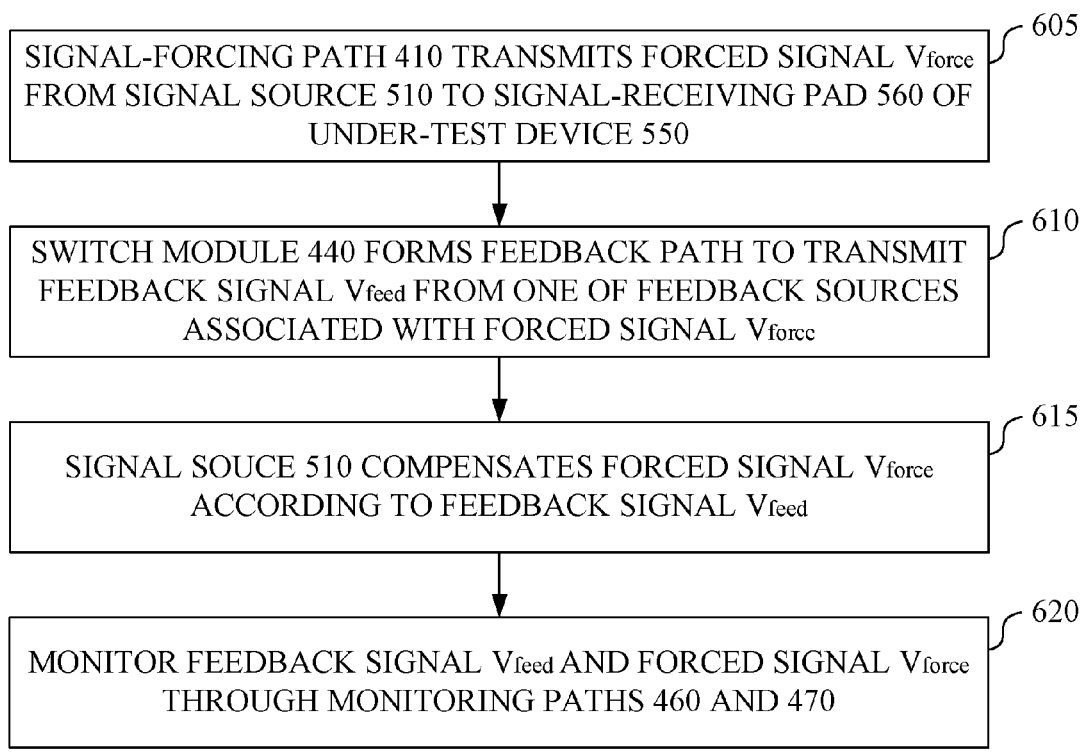
FIG. 6 is an exemplary diagram of an operation method in accordance with various embodiments of the present disclosure.

FIG. 6 is an exemplary diagram of an operation method 600 in accordance with various embodiments of the present disclosure. In some embodiments, the operation method 600 is applied to the test fixture 400 and the test equipment 500 illustrated in FIG. 4 and FIG. 5. For illustration, operations of the test fixture 400 and the test equipment 500 illustrated in FIG. 4 and FIG. 5 are described by the operation method 600.

In operation 605, the signal-forcing path 410 transmits the forced signal $V_{force}$ generated from the signal source 510 to a signal-receiving pad 560 of the under-test device 550.

In operation 610, the switch module 440 forms a feedback path. The feedback path transmits the feedback signal $V_{feed}$ from one of the feedback sources to the signal-sensing path 420.

In some embodiments, the test fixture 400 further includes a control module 450 to control the switch module 440 to form the feedback path.

In operation 615, the signal source 510 compensates the forced signal $V_{force}$ according to the feedback signal $V_{feed}$.

In some approaches, the forced signal $V_{force}$ applied to the signal-receiving pad 560 is further transmitted to other circuit modules (not shown) in the under-test device 550. The effect of the IR drop in the under-test device 550 decreases the forced signal $V_{force}$ and results in an inaccurate test result.

Compared to the preceding approaches, in the present disclosure, the forced signal $V_{force}$ is compensated according to the feedback signal $V_{feed}$ from various feedback sources on the under-test device 550. As a result, the inaccurate test result is able to be avoided.

For illustration, the switch module 440 forms the feedback path to transmit the feedback signal $V_{feed}$ from the under-test pad 570B, as illustrated in FIG. 4. The signal source 510 performs compensation on the forced signal $V_{force}$ according to the feedback signal $V_{feed}$ from the under-test pad 570B.

In some approaches, the effect of the IR drop in the signal-forcing path 410 in the test fixture 400 decreases the forced signal $V_{force}$.

Compared to the preceding approaches, in the present disclosure, the forced signal $V_{force}$ is compensated according to the feedback signal $V_{feed}$ from the signal-forcing path 410, as illustrated in FIG. 5. As a result, the inaccurate test result is able to be avoided.

In some embodiments, the feedback sources are electrically independent from each other.

In operation 620, the feedback signal $V_{feed}$ and the forced signal $V_{force}$ are monitored through a monitoring path 460 and a monitoring path 470, respectively.

In some embodiments, the test equipment 500 further includes a monitoring module 520. The monitoring module 520 is connected to the monitoring path 460 and the monitoring path 470. For illustration, the monitoring path 460 is connected to the signal-sensing path 420 to receive the feedback signal $V_{feed}$ therefrom.

On the other hand, in some embodiments, the monitoring path 470 is connected to the signal source 510 to directly receive the forced signal $V_{force}$. The forced signal $V_{force}$ generated directly from the signal source 510 is not transmitted through the signal-forcing path 410. Therefore, the forced signal $V_{force}$ received by the monitoring path 470 does not suffer from the effect of the IR drop in the signal-forcing path 410. As a result, whether the forced signal $V_{force}$ generated by the signal source 510 is accurate can be determined.

As a result, the monitoring module 520 monitors the signals from the under-test device 550, the signal-forcing path 410 and the signal source 510. In some embodiments, the monitoring module 520 displays the monitored signals for the user to observe.

Based on the operation of the test fixture 400 and the test equipment 500, the switch module 440 is operated to form the feedback path. The feedback signal $V_{feed}$ is then transmitted from one of the feedback sources associated with the forced signal $V_{force}$ through the feedback path. The feedback signal is used to determine whether the effect of IR drop decreases the voltage in these feedback sources. As a result, the forced signal $V_{force}$ is compensated by the signal source 510 accordingly. The inaccurate test result can be avoided.

In some embodiments, the components in the test fixture 400 and the test equipment 500 are integrated in the test fixture 100 and the test equipment 200 illustrated in FIG. 1A. As a result, the components in the test fixture 100 and the test equipment 200 perform the discharging operations in the discharging mode. Subsequently, in the operation mode, the components in the test fixture 400 and the test equipment 500 perform the compensating operations.

Figure 7:
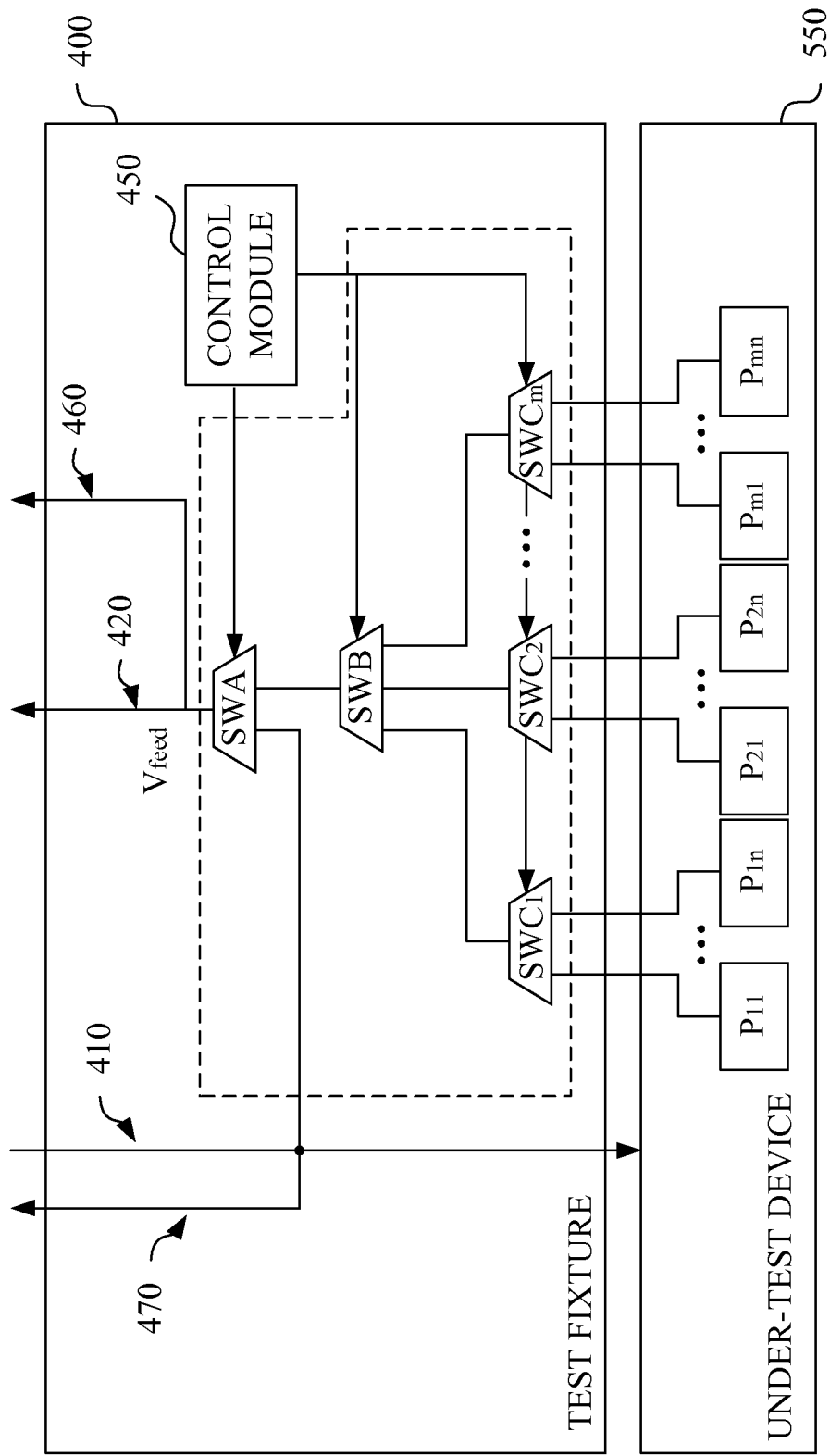
FIG. 7 is an exemplary diagram of the test fixture together with the under-test device in accordance with various embodiments of the present disclosure.

FIG. 7 is an exemplary diagram of the test fixture 400 together with the under-test device 550 in accordance with various embodiments of the present disclosure.

In some embodiments, the switch module 440 further includes switches SWA, SWB and $SWC_1$-$SWC_m$.

In some embodiments, the under-test device 550 is a three-dimensional (3-D) stack circuit. The 3-D stack circuit includes a plurality of circuit tiers (not labeled), and each of the circuit tiers includes a plurality of circuit layers (not labeled). Each of the circuit layers further includes one of a plurality of under-test points.

In some embodiments, the under-test device 550 includes m circuit tiers. Each of the circuit tiers includes n circuit layers. Each of the circuit layers includes one of the under-test points $P_{11}$-$P_{1n}$, $P_{21}$-$P_{2n}$, . . . and $P_{m1}$-$P_{mn}$.

In some embodiments, each of the under-test points $P_{11}$-$P_{1n}$, $P_{21}$-$P_{2n}$, . . . and $P_{m1}$-$P_{mn}$ are electrically connected to one of the under-test pads e.g., the under-test pad 570A, 570B or 570C. As a result, the under-test points $P_{11}$-$P_{1n}$, $P_{21}$-$P_{2n}$, . . . and $P_{m1}$-$P_{mn}$ are electrically connected to the switch module 440 through the under-test pads.

As a result, each of the switches $SWC_1$-$SWC_m$ selects the under-test point in one of the n circuit layers. The switch SWB selects one of the m circuit tiers. Moreover, the switch SWA selects one of feedback sources including the signal-forcing path 410 and the under-test points in the under-test device 550.

According to the selection performed by the switches SWA, SWB and $SWC_1$-$SWC_m$ in the switch module 440, the feedback path is formed to transmit the feedback signal from one of the signal-forcing path 410 and the under-test pads corresponding to the under-test points $P_{11}$-$P_{1n}$, $P_{21}$-$P_{2n}$, . . . and $P_{m1}$-$P_{mn}$.

In some embodiments, the switch module 440 is disposed in the under-test device 550. Under such a condition, only one under-test pad is necessary to be disposed on the under-test device 550. Moreover, the test fixture 400 receives the feedback signal $V_{feed}$ from the switch module 440 through the under-test pad and further transmits the feedback signal $V_{feed}$ through the feedback path.

In some embodiments, a circuit is disclosed that includes a signal-forcing path, a discharging path, a contact probe, a monitoring probe and a switch module. The signal-forcing path is connected to a signal source. The discharging path is connected to a discharging voltage terminal. The contact probe is configured to contact a pad module of an under-test device. The monitoring probe is configured to generate a monitored voltage associated with the pad module. The switch module is configured to be operated in a discharging mode to connect the contact probe to the discharging path when the monitored voltage does not reach a threshold voltage and be operated in an operation mode to connect the contact probe to the signal-forcing path when the monitored voltage reaches the threshold voltage such that a signal generated by the signal source is forced to the under-test device.

Also disclosed is a circuit that comprises a signal-forcing path, a signal-sensing path, a signal-forcing probe and a switch module. The signal-forcing path is connected to a signal source. The signal-sensing path is connected to the signal source. The signal-forcing probe is configured to connect the signal-forcing path to a signal-receiving pad of an under-test device to transmit a forced signal generated by the signal source thereto. The switch module is configured to form a feedback path to transmit a feedback signal from one of a plurality of feedback sources electrically independent to each other to the signal-sensing path such that the forced signal is compensated by the signal source according to the feedback signal, wherein the feedback sources are associated with the forced signal and comprise a plurality of under-test pads of the under-test device and the signal-forcing path.

Also disclosed is a method that includes the operations outlined below. A distance between a contact probe and a pad module of an under-test device is adjusted to approach the contact probe to the pad module. A first switch module is operated in a discharging mode to connect the contact probe to a discharging path that is connected to a discharging voltage terminal. A monitored voltage associated with the pad module is generated by a monitoring probe. The monitored voltage is determined to reach a threshold voltage to further determine that the contact probe contacts the pad module and the under-test device is discharged. The first switch module is operated in an operation mode to connect the contact probe to a signal-forcing path that is connected to a signal source to force a signal to the under-test module.

In this document, the term "connected" may be termed as "electrically connected", and the term "coupled" may be termed as "electrically coupled". "Connected" and "coupled" may also be used to indicate that two or more elements cooperate or interact with each other.

The number and configuration of the contact probes, the monitoring probes, the signal-forcing path, and the pad modules therein in this document are for illustrative purposes. Various numbers and configurations of the contact probes and the monitoring probes therein are within the contemplated scope of the present disclosure.

The number of the monitoring probe therein in this document is for illustrative purposes. In some embodiments, each of the contact probes is accompanied by a monitoring probe to determine whether each of the contact probes contacts the corresponding pad module. In some embodiments, a plurality of contact probes share one monitoring probe. The contact probes are determined to contact the corresponding pad modules once the monitored voltage generated by the monitoring probe reaches the threshold value.

The number of the threshold value therein in this document are for illustrative purposes. Various amounts of the threshold value therein are within the contemplated scope of the present disclosure.

The number and configuration of the signal-forcing probe, the signal-forcing path, the signal-sensing path and the signal-receiving pad therein in this document are for illustrative purposes. Various numbers and configurations of the contact probes and the monitoring probes therein are within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a signal-forcing path coupled to a signal source;
   a discharging path coupled to a discharging voltage terminal;
   a contact probe configured to contact a pad module of an under-test device;
   a monitoring probe configured to generate a monitored voltage associated with the pad module;
   a switch module; and
   a control module configured to operate the switch module in one of a discharging mode and an operation mode depending on the monitored voltage,
   wherein the switch module is operated in the discharging mode to connect the contact probe to the discharging path, in a condition that the monitored voltage does not reach a threshold voltage, and
   the switch module is operated in the operation mode to connect the contact probe to the signal-forcing path and disconnect the contact probe from the discharging voltage terminal, in a condition that the monitored voltage reaches the threshold voltage such that a signal generated by the signal source is forced to the under-test device.

2. The circuit of claim 1, further comprising a test equipment comprising the signal source and the discharging voltage terminal.

3. The circuit of claim 2, wherein the signal-forcing path, the discharging path, the contact probe, the switch module and the monitoring probe are comprised by a test fixture, and the test fixture and the test equipment are discharged in an initialization stage.

4. The circuit of claim 1, wherein a non-zero voltage is forced to the pad module from the signal source through the signal-forcing path in the operation mode to perform a short-circuit detection.

5. The circuit of claim 1, wherein a neutralization voltage is forced to the pad module from the signal source through the signal-forcing path in the operation mode to neutralize electric charges in the under-test device.

6. The circuit of claim 1, wherein either a data signal, a power signal or a ground signal is forced to the pad module through the signal-forcing path in the operation mode.

7. The circuit of claim 1, wherein the pad module comprises a single pad configured to be contacted by both of the contact probe and the monitoring probe, or the pad module comprises two electrically coupled pads configured to be contacted by the contact probe and the monitoring probe respectively.

8. The circuit of claim 1, wherein the threshold voltage is a ground voltage.

9. A circuit, comprising:
   a signal-forcing path configured to transmit a forced signal outputted by a signal source;
   a signal-sensing path coupled to the signal source;
   a signal-forcing probe configured to connect the signal-forcing path to a signal-receiving pad of an under-test device to transmit the forced signal; and
   a switch module configured to form a feedback path to transmit a feedback signal from one of a plurality of feedback sources electrically independent to each other, to the signal source via the signal-sensing path, wherein the signal-forcing path is further configured to transmit the forced signal in which an IR-drop is compensated, according to the feedback signal, to the under-test device;
   wherein the feedback sources are associated with the forced signal and comprise a plurality of under-test pads of the under-test device and the signal-forcing path.

10. The circuit of claim 9, further comprising a test equipment comprising the signal source.

11. The circuit of claim 10, further comprising a first monitoring path coupled to the signal-sensing path, wherein the test equipment further comprises a monitoring module to monitor the feedback signal through the first monitoring path.

12. The circuit of claim 10, further comprising a second monitoring path coupled to the signal-forcing module, wherein the monitoring module further monitors the forced signal through the second monitoring path.

13. The circuit of claim 9, wherein the under-test device comprises a plurality of circuit tiers each comprising a plurality of circuit layers each comprising at least one of the under-test points each corresponding to one of the under-test pads, and the switches comprise:
   a plurality of first switches each to select one of the circuit tiers;
   a plurality of second switches each to select one of the circuit layers in one of the circuit tiers; and
   a plurality of third switches each to select one of the under-test points in one of the circuit layers.

14. The circuit of claim 9, further comprising a control module to operate the switch module.

15. A method comprising:
   adjusting a distance between a contact probe and a pad module of an under-test device to make the contact probe contact the pad module;

generating a monitored voltage associated with the pad module by a monitoring probe; and operating, by a control module, a first switch module in one of a discharging mode and an operation mode depending on a threshold voltage, wherein in a condition that the monitored voltage does not reach the threshold voltage, the first switch module is operated in the discharging mode to connect the contact probe to a discharging path that is coupled to a discharging voltage terminal, and in a condition that the monitored voltage reaches the threshold voltage, the first switch module is operated in the operation mode to connect the contact probe to a signal-forcing path that is coupled to a signal source to force a signal to the under-test module and to disconnect the contact probe from the discharging voltage terminal.

16. The method of claim 15, further comprising:
forcing a non-zero voltage to the pad module in the operation mode to perform a short-circuit detection.

17. The method of claim 15, further comprising:
forcing a neutralization voltage to the pad module in the operation mode to neutralize electric charges in the under-test device.

18. The method of claim 15, further comprising:
connecting the signal-forcing path to a signal-receiving pad of the under-test device to transmit a forced signal from the signal source thereto; and operating a second switch module to form a feedback path to transmit a feedback signal from one of a plurality of feedback sources electrically independent to each other to a signal-sensing path such that the forced signal is compensated according to the feedback signal, wherein the feedback sources comprises a plurality of under-test pads of the under-test device and the signal-forcing path.

19. The method of claim 15, further comprising:
monitoring the feedback signal through a first monitoring path coupled to the signal-sensing path; and monitoring the forced signal through a second monitoring path coupled to the signal source.

20. The circuit of claim 1, wherein, in a condition that the switch module is operated in the discharging mode, the switch module is configured to disconnect the contact probe from the signal-forcing path.

* * * * *